United States Patent
Hara et al.

(10) Patent No.: US 7,180,822 B2
(45) Date of Patent: Feb. 20, 2007

(54) SEMICONDUCTOR MEMORY DEVICE WITHOUT DECREASING PERFORMANCE THEREOF EVEN IF REFRESH OPERATION OR WORD LINE CHANGING OPERATION OCCUR DURING BURST OPERATION

(75) Inventors: Kota Hara, Kawasaki (JP); Shinichi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/994,632

(22) Filed: Nov. 23, 2004

(65) Prior Publication Data

US 2005/0265116 A1    Dec. 1, 2005

(30) Foreign Application Priority Data

May 25, 2004   (JP)   ............................. 2004-154561

(51) Int. Cl.
*G11C 8/00* (2006.01)
(52) U.S. Cl. ..................... 365/233; 365/191
(58) Field of Classification Search ............... 365/233, 365/191
See application file for complete search history.

(56) References Cited

U.S. PATENT DOCUMENTS

| | | | |
|---|---|---|---|
| 5,748,560 A  * | 5/1998 | Sawada | ..................... 365/233 |
| 6,072,749 A | 6/2000 | Nakamura et al. | |
| 6,208,582 B1 | 3/2001 | Kanda et al. | |
| 6,307,806 B1 | 10/2001 | Tomita et al. | |
| 6,510,097 B2 * | 1/2003 | Fukuyama | ............. 365/230.03 |
| 2005/0073903 A1 * | 4/2005 | Fujioka et al. | |
| 2005/0226090 A1 * | 10/2005 | Lee | |

FOREIGN PATENT DOCUMENTS

| | | |
|---|---|---|
| EP | 1 050 882 A2 | 11/2000 |
| EP | 1 406 267 A1 | 4/2004 |
| JP | 11-283385 | 10/1999 |
| JP | 2000-113671 | 4/2000 |
| JP | 2001-167576 | 6/2001 |

* cited by examiner

*Primary Examiner*—Michael Tran
(74) *Attorney, Agent, or Firm*—Arent Fox PLLC.

(57) ABSTRACT

A semiconductor memory device, in which a burst operation is performed using a memory core, has a read/write trigger signal generating circuit and a read/write signal generating circuit. The read/write trigger signal generating circuit generates a read/write signal request from a predetermined timing signal during the burst operation. The read/write signal generating circuit receives an output signal from the read/write trigger signal generating circuit and outputs a read/write signal after a core operation just prior to receipt of the output signal is complete and the subsequent activation of a row side is complete.

19 Claims, 7 Drawing Sheets

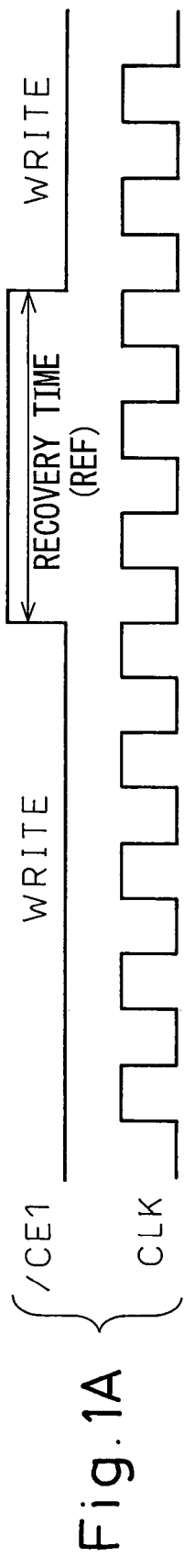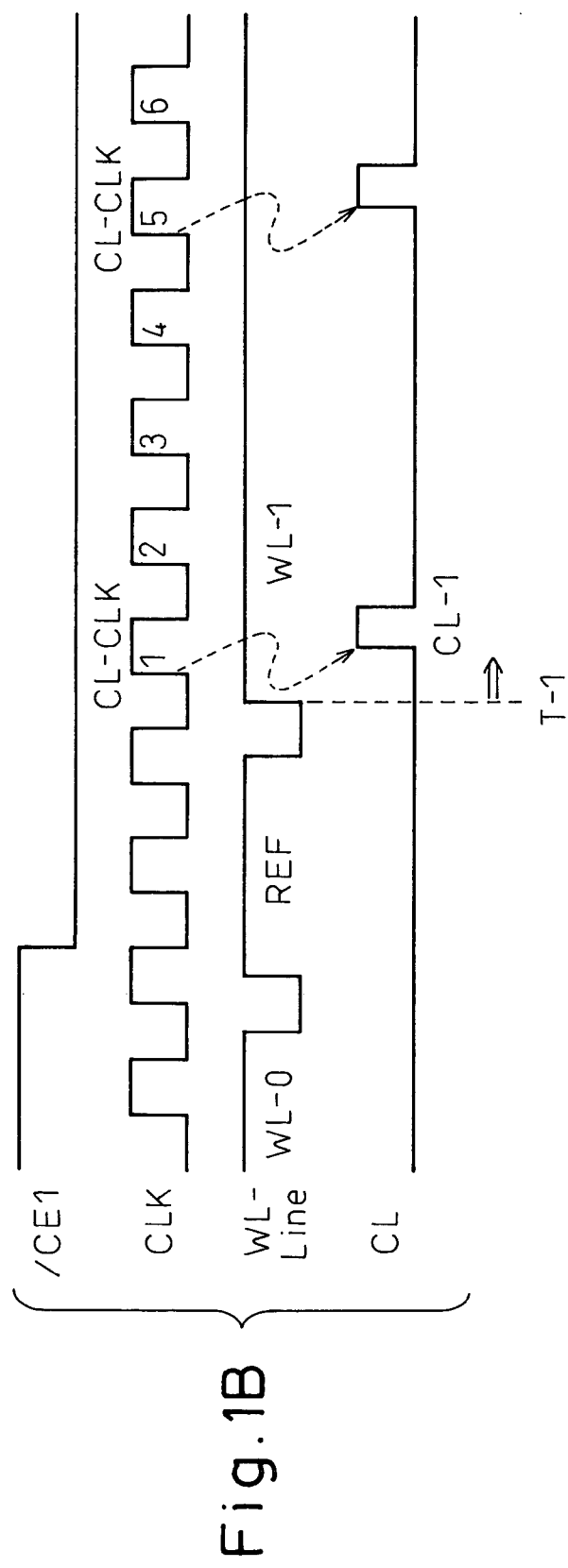

US 7,180,822 B2

SEMICONDUCTOR MEMORY DEVICE WITHOUT DECREASING PERFORMANCE THEREOF EVEN IF REFRESH OPERATION OR WORD LINE CHANGING OPERATION OCCUR DURING BURST OPERATION

CROSS REFERENCE TO RELATED APPLICATION

This application is based upon and claims the benefit of priority from the prior Japanese Patent Application No. 2004-154561, filed on May 25, 2004, the entire contents of which are incorporated herein by reference.

BACKGROUND OF THE INVENTION

1. Field of the Invention

The present invention relates to a semiconductor memory device and to a method of controlling a semiconductor memory device and, more particularly, to a semiconductor memory device using a DRAM memory core which requires high-speed processing and a method of controlling the same.

2. Description of the Related Art

In recent years, a burst operation has often been used for fast access to a semiconductor memory device (memory). A burst operation is intended to execute data input/output from and to the outside at high speed. In the burst operation, an address given when a read or write command is given from the outside is set as an initial value and after that, subsequent necessary addresses are internally generated and are synchronized with an external signal (clock signal: CLK). For example, a synchronous DRAM (SDRAM) has such a function. In a known semiconductor memory device, a read/write signal (CL) to output data from a memory core after sense-amplification is generated from "CLK". "CL" is used to activate the sense amplifier to read data from the memory core in case of a read operation (READ), and is used to write data to the memory core in case of a write operation (WRITE).

Moreover, for example, in case of a pseudo static RAM (SRAM) interface, a refresh operation (REF) is carried out in intervals of READ or WRITE. In case of a semiconductor memory device in which a burst operation with an unlimited burst length (BL) is possible, a row address can be changed during the burst operation and this requires a change of a word line.

The REF and the changing of the word line can interfere with a periodical read/write signal request (CL request) from "CLK". If the REF and the changing operation of the word line have a priority, a recovery time and a cycle performance is sacrificed and this decreases the performance of the semiconductor memory device.

Regarding a prior memory having a burst mode, a memory was suggested in which a mask control of a data bus for processing is carried out in response to a mask signal which requires a prohibition of a predetermined write operation whereby high-speed reading is made possible (for example, refer to Japanese Unexamined patent Publication (Kokai) No. 11-283385).

Moreover, conventionally, a memory device has been proposed in which a write amplifier control circuit activates a write amplifier when writing according to a command, and inactivates the write amplifier in response to a data mask signal when writing, and a column decoder control circuit controls an activation of a column decoder so that the column decoder is not activated in response to the data mask signal (for example, refer to Japanese Unexamined Patent Publication (Kokai) No. 2000-113671).

Furthermore, a semiconductor integrated circuit has been proposed in which an internal circuit starts an operation on receiving an address signal before fetching a command signal and an address changing circuit inhibits a transmission of the address signal to the internal circuit on receiving an internal command signal or a clock signal in order to enable a high-speed operation and allow a decrease in power consumption (for example, refer to Japanese Unexamined Patent Publication (Kokai) No. 2001-167576).

The prior art and its associated problems will be described in detail later with reference to accompanying drawings.

SUMMARY OF THE INVENTION

According to the present invention, there is provided a semiconductor memory device in which a burst operation is performed using a memory core, comprising a read/write trigger signal generating circuit generating a read/write signal request from a predetermined timing signal during the burst operation; and a read/write signal generating circuit receiving an output signal from the read/write trigger signal generating circuit, and outputting a read/write signal after a core operation just prior to receipt of the output signal is complete and a subsequent activation of a row side is complete.

The semiconductor memory device may further comprise a clock trigger signal generating circuit to generate a clock trigger signal from a clock signal wherein, when an output signal of the clock trigger signal generating circuit and an output signal of the read/write trigger generating circuit are both received, the read/write signal generating circuit generates the read/write signal.

Further, according to the present invention, there is provided a semiconductor memory device in which a burst operation is performed using a memory core, wherein a read/write signal request is generated from a predetermined timing signal during the burst operation, but no read/write signal is generated until the core operation just prior to generation of the read/write signal request is complete and the subsequent activation of a row side is complete.

The predetermined timing signal may be a clock signal or an internal timing signal. During the burst operation, a column address and a row address may be internally generated and, when the column address is at the top, a reset operation of the row side may be carried out and immediately thereafter, a word line of the next row address may be activated so that the burst operation may be sequentially continued. The generation of the read/write signal may be kept waiting in both the reading and the writing operations.

The read/write signal may be generated when a read/write trigger signal generated from a command signal and a clock trigger signal generated from a clock signal are received. If a first read/write signal is output, a second read/write signal trigger signal may be generated which is equivalent to a first read/write trigger signal generated from a command signal taking a timing from the first read/write signal, and when the second read/write trigger signal and a clock trigger signal generated at the next clock timing are both received, a subsequent read/write signal may be generated.

When a column address and a row address are internally generated during the burst operation and a reset operation is performed at the instant of the column address being at the top and, immediately thereafter, a word line of the next row address is activated, to continue the burst operation, a third read/write trigger signal may be generated by taking timing from a word line start-up signal, and when the third read/write trigger signal and a clock trigger signal generated in the next clock timing are received, a subsequent read/write signal may be generated.

The semiconductor memory device may be a DRAM. The DRAM may be structured as a pseudo SRAM.

According to the present invention, there is also provided a method of controlling a semiconductor memory device in which a burst operation is performed using a memory core requiring a refresh operation, wherein a read/write signal request is generated from a predetermined timing signal during the burst operation but a read/write signal is not generated until the latest core operation is complete and the subsequent activation of a row side is complete.

The predetermined timing signal may be a clock signal or an internal timing signal. During the burst operation, a column address and a row address may be internally generated, and when the column address is at the top, a reset operation of the row side may be performed and, immediately thereafter, a word line of the next row address may be activated so that the burst operation may be sequentially continued. The generation of the read/write signal may be kept waiting in both the reading and the writing operations. The read/write signal may be generated when a read/write trigger signal generated from a command signal and a clock trigger signal generated from a clock signal are received.

If a first read/write signal is output, a second read/write signal trigger signal may be generated which is equivalent to a first read/write trigger signal generated from a command signal taking a timing from the first read/write signal, and when the second read/write trigger signal and a clock trigger signal generated at the next clock timing are received, the subsequent read/write signal may be generated. When a column address and a row address are internally generated during the burst operation and a reset operation is performed at the instant of the column address being at the top and a word line of the next row address is activated, to continue the burst operation, a third read/write trigger signal may be generated taking a timing from a word line start-up signal, and when the third read/write trigger signal and a clock trigger signal generated in the next clock timing are received, the subsequent read/write signal may be generated.

The semiconductor memory device may be a DRAM. The DRAM may be structured as a pseudo SRAM.

BRIEF DESCRIPTION OF THE DRAWINGS

The present invention will be more clearly understood from the description of the preferred embodiments as set forth below with reference to the accompanying drawings, wherein:

FIG. 1A and FIG. 1B show an example of write operation signal waveforms when a refresh operation is carried out during a burst operation in a known semiconductor memory device;

DESCRIPTION OF THE PREFERRED EMBODIMENTS

Figure 2:
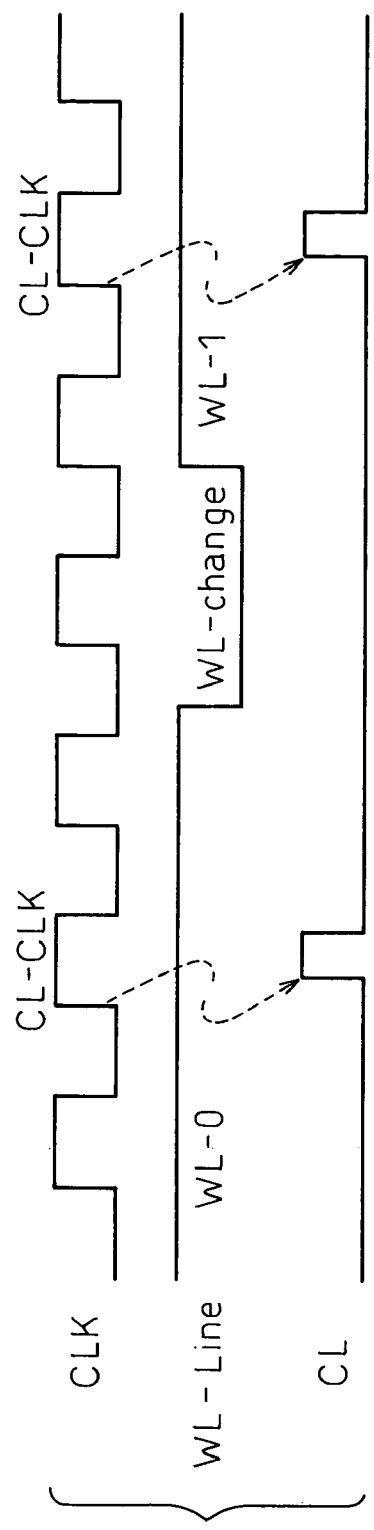
FIG. 2 shows an example of a write operation signal waveforms when a word line changing is carried out during a burst operation in a known semiconductor memory device.

Before proceeding to the detailed description of the preferred embodiments of the present invention, the prior art display apparatuses and display driving methods and their associated problems will be described with reference to FIG. 1A, FIG. 1B and FIG. 2.

FIG. 1A and FIG. 1B show an example of write operation signal waveforms when refreshed during a burst operation in a known semiconductor memory device. FIG. 1A shows a general relation of a clock signal (CLK) and a chip enable signal (/CE1), and FIG. 1B shows signal waveforms in the write operation (WRITE) when a refresh operation (REF) is performed between a burst operation (WRITE) of a word line 0 (WL-0) and a burst operation (WRITE) of a word line 1 (WL-1). In the drawings, a CL request is generated from "CLK" at a CLK cycle corresponding to four CLK pulses in FIG. 1B and "CLK" at which the CL request is generated is indicated by "CL-CLK".

As shown in FIG. 1B, in a known semiconductor memory device, REF (refresh operation) is performed between the previous "WRITE" (write operation to the word line WL-0) and the subsequent WRITE (write operation to the word line 1 WL-1), therefore, the first CL signal (CL1) must be generated after the timing T-1 in which the pulse on the word line (WL-1) of the burst address is raised after the completed REF.

Accordingly, "CL-CLK" (CL request from CLK: CL-1) must be generated after the timing T-1, and as a result, this decreases the performance of the semiconductor memory device such that a recovery time to perform REF is elongated, the following command input is delayed, the value of latency of the semiconductor memory device is increased, or a time from an external control signal input to an inside CLK operation start is delayed. In FIG. 1B, the latency is 3, and after /CE1 is low-level "L", outside data taking is started and REF request is performed if it is generated before "/CE1" is transferred from high level "H" to low level "L". If a REF request is generated after the transfer, the REF is performed after a burst operation is complete.

FIG. 2 shows an example of write operation signal waveforms if a word line is changed during the burst operation in a known semiconductor memory device. In FIG. 2, a CL request is generated from a CLK at a cycle corresponding to four CLK pulses, and the "CLK", where the CL request is generated, is represented as CL-CLK.

As shown in FIG. 2, in a semiconductor memory device in which a burst operation with an unlimited burst length (BL) is possible, "CL-CLK" interval over word line changing must be set as 4CLK if the word line changing is not complete within 4CLKs, namely, CLK cycle is required to set long, and therefore, this reduces the performance of the semiconductor memory device.

In view of the problems of the prior semiconductor memory device as described above, an object of the present invention is to provide a semiconductor memory device without decreasing the performance if a refresh operation and a word line changing operation are performed during a burst operation. Specifically, the present invention is aimed to provide a semiconductor memory device and a controlling method of the semiconductor memory device in which, for example, if a refresh operation and a word line changing operation is performed during a burst operation, a performance reduction, such as elongating a recovery time to perform REF, delaying an input of the following command, increasing the value of latency of the semiconductor memory device, delaying a time from an input of an outside control signal to a start of an inside CLK operation, or elongating a cycle of a clock signal, does not occur.

Below, embodiments of a semiconductor memory device and a method of controlling the semiconductor memory device according to the present invention will be described in detail with reference to the accompanying drawings.

Figure 3:
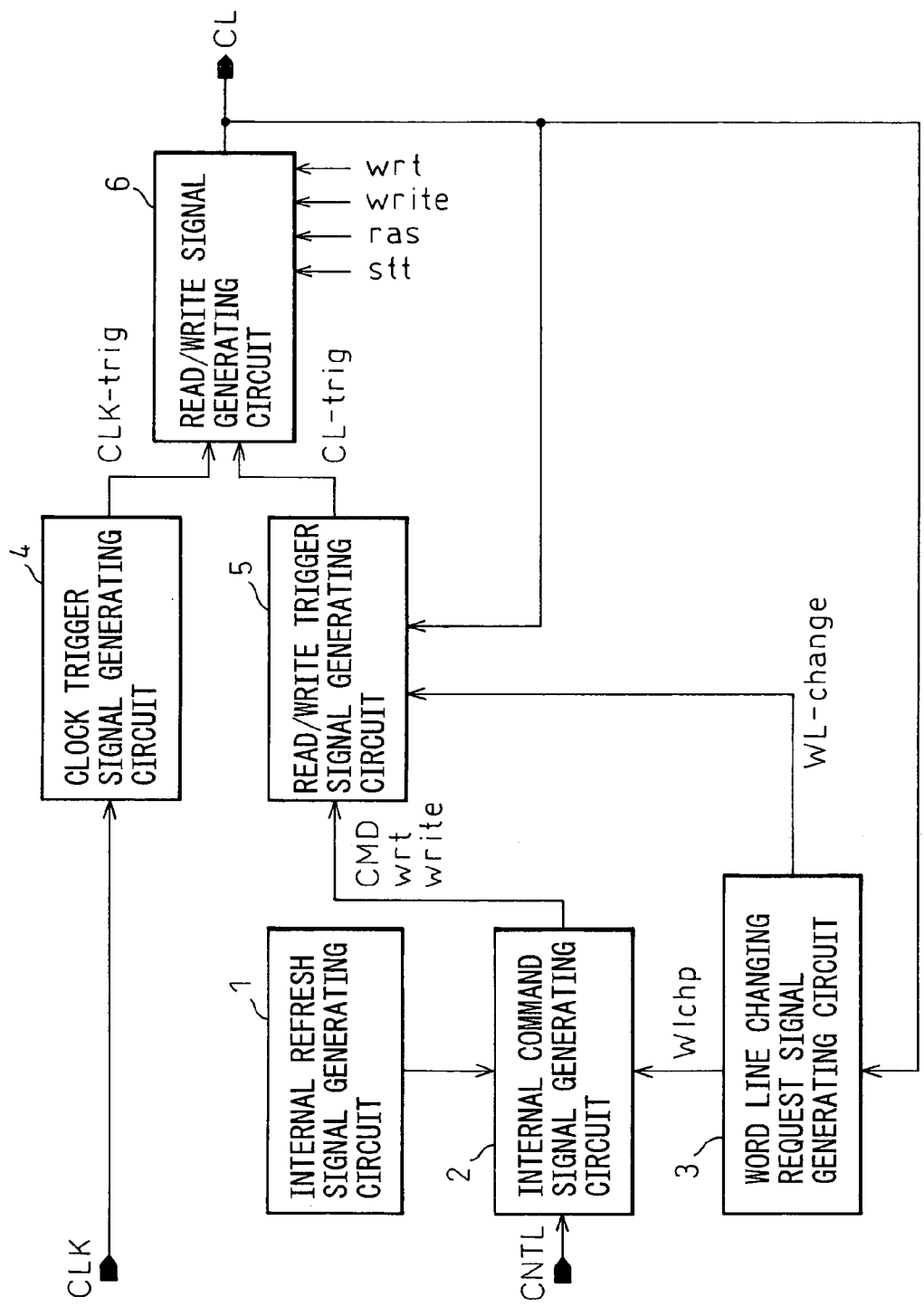
FIG. 3 is a block diagram schematically showing an embodiment of a semiconductor memory device of the present invention.

FIG. 3 is a block diagram schematically showing an embodiment of a semiconductor memory device of the present invention. Reference numeral 1 denotes an internal refresh signal generating circuit, 2 denotes an internal command signal generating circuit, 3 denotes a word line changing request signal generating circuit, 4 denotes a clock trigger signal generating circuit, 5 denotes a read/write trigger signal generating circuit, and 6 denotes a read/write signal generating circuit.

As shown in FIG. 3, in a semiconductor memory device of the embodiment, a clock signal (CLK) from the outside is input into a clock trigger signal generating circuit 4 and, for example, a clock trigger signal (CLK-trig: a pulse signal) is generated at a cycle corresponding to four "CLK" pulses. The internal refresh signal generating circuit 1 is used to maintain information stored in a DRAM core used, for example, as a pseudo SRAM by refreshing the same internally. A signal from the internal refresh signal generating circuit 1 is input to the clock trigger signal generating circuit 4 with a word line changing request signal (wlchp) from the word line changing request signal generating circuit.

An external control signal (CNTL) is input into the internal command signal generating circuit 2 to generate an internal command signal (CMD: pulse signal) and a state signal (wrt, write) according to a read/write (READ/WRITE) when a command is input. The state signal "wrt" changes at a timing when a chip enable signal (/CE1) is off, and the state signal "write" changes at a timing when a word line select signal (WL-Line) is off (refer to FIG. 6).

The word line changing request signal generating circuit 3 generates not only "wlchp" as described above but also a state signal "WL-change", which represents changing of the word line, to input into the read/write trigger signal generating circuit 5. The CLK-trig from the clock trigger signal generating circuit 4 and the read/write trigger signal (CL-trig) from the read/write trigger signal generating circuit 5 are input into the read/write signal generating circuit 6. A start signal "stt" to perform a reset process when the semiconductor memory device starts up, a row address strobe signal "ras", the state signals "wrt" and "write" are input into the read/write signal generating circuit 6 to output the read/write signal (CL). The "CL" is fed back to the word line changing request signal generating circuit 3 and the read/write trigger signal generating circuit 5. If the CNTL is input during a refresh operation (REF) and the "CMD" is generated according to READ/WRITE, the generation of the "CMD" from the internal command signal generating circuit 2 is kept waiting until the REF is complete. The details will be described hereinafter with reference to FIG. 6.

Next, for example, in a semiconductor memory device in which a burst operation with unlimited burst length is possible, if a write operation is performed to a word line (for example, WL-0) and a column address is top, the word line changing request signal generating circuit 3 generates the "wlchp" and WL-change from "CL" at that time. If the "wlchp" is generated, the word line is switched (for example, from WL-0 to WL-1), and a "CMD" is output from the internal command signal generating circuit again. A first "CL-trig" for the word line changing is output from the "CMD". The read/write signal generating circuit 6 generates a "CL" from the "CLK-trig" and "CL-trig". The details will be described hereinafter with reference to FIG. 7.

Figure 4:
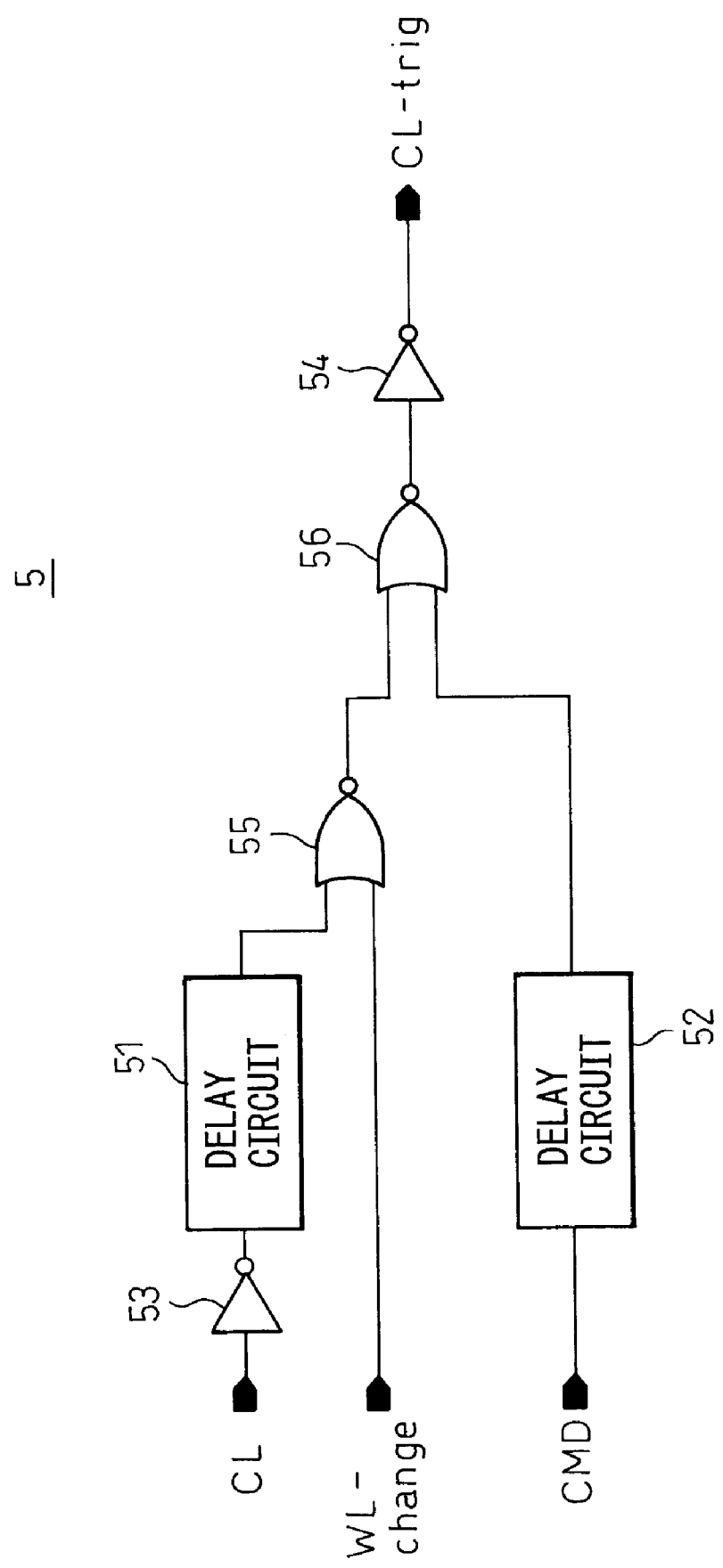
FIG. 4 is a circuit diagram showing an example of a read/write trigger signal generating circuit in a semiconductor memory device in FIG. 3.

FIG. 4 is a circuit diagram showing an example of a read/write trigger signal generating circuit in a semiconductor memory device shown in FIG. 3.

As shown in FIG. 4, the read/write trigger signal generating circuit 5 is structured to be provided with, for example, delay circuits 51, 52, inverters 53, 54, and NOR gates 55, 56.

When a command is input, CL-trig is generated by taking the timing with the delay circuit 52 from "CMD". Once "CL" is generated, "CL-trig" is generated sequentially by taking the timing with the delay circuit 51. The delay circuit 52 determines the time from selection (start up) of the word line to activation of sense amplifier and completion of data output preparation, and the delay circuit 51 determines the time to keep CL output waiting after the first CL output is operated until a core circuit completes the subsequent CL output preparation (corresponding to the delay time D1 in FIG. 6). When the word line is changed, "WL-change" is in a high level "H" from the CL output to completion of word line changing, and an output of "CL-trig" from "CL" is stopped at that time.

Figure 5:
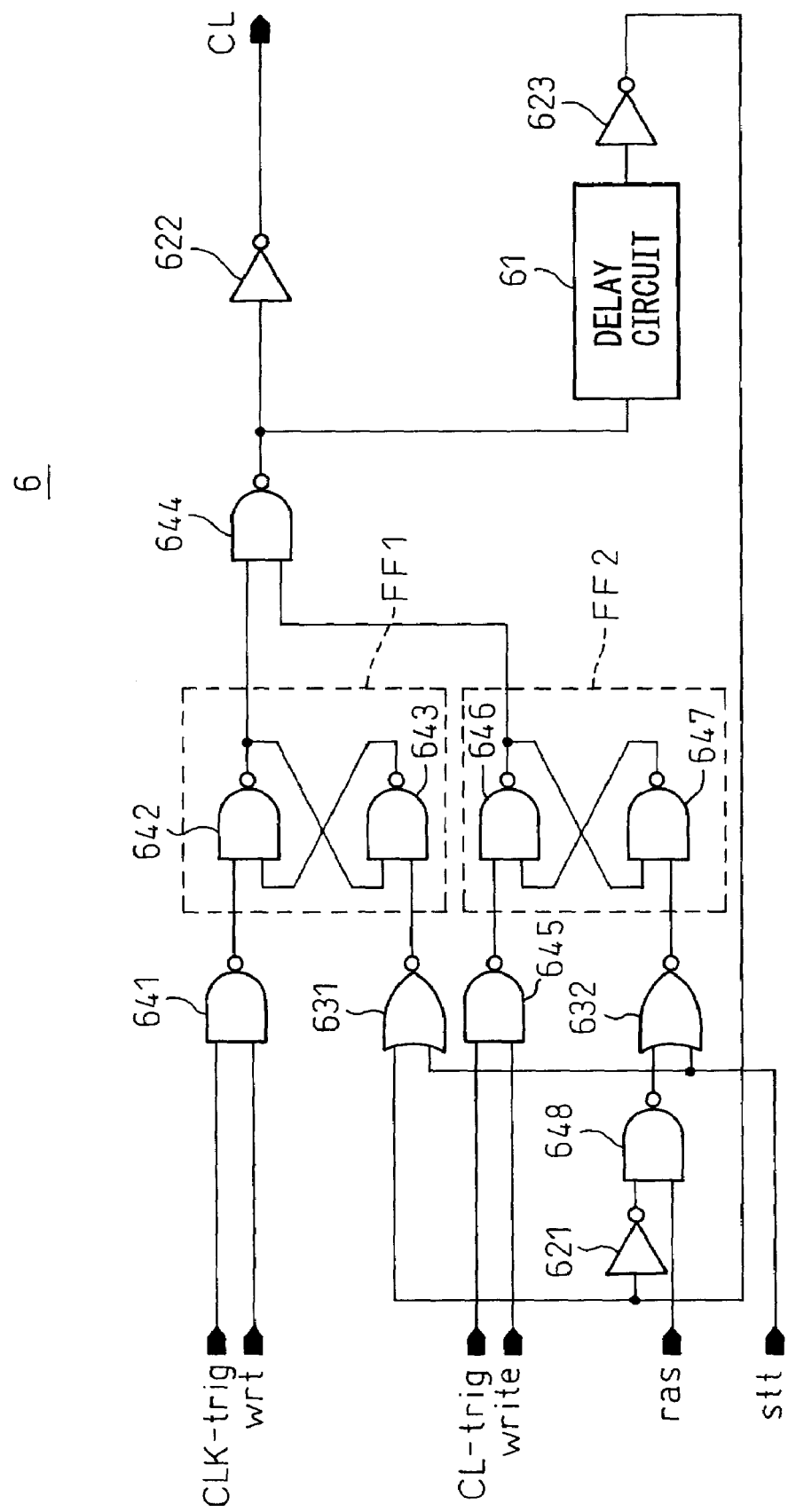
FIG. 5 is a circuit diagram showing an example of a read/write signal generating circuit in a semiconductor memory device in FIG. 3.

FIG. 5 shows a circuit diagram showing an example of read/write signal generating circuit in the semiconductor memory device shown in FIG. 3.

As shown in FIG. 5, for example, the read/write signal generating circuit 6 comprises a delay circuit 61, inverters 621 to 623, NOR gates 631, 632, and NAND gates 641 to 648. The NAND gates 642 and 643 constitute a first flip-flop FF1, and the NAND gates 646 and 647 constitute a second flip-flop FF2.

The first flip-flop FF1 is set by "CLK-trig" and the second flip-flop FF2 is set by "CL-trig". When both flip-flops FF1, FF2 are set, a pulse of which the width is determined by the delay circuit 61 is output as CL. Both signals "wrt" and "write" become a high level "H" in write state, and "wrt" synchronizes with CLK (/CE1) and write synchronizes with "CL" (WL-Line). However, they are not always identical and therefore, "wrt" and write are different. Moreover, "ras" is in high level when the pulse of the word line is raised, and to surely reset the second flip-flop FF2 when the pulse of the word line is output. "Stt" is in a high level "H" only when power is applied and is in a low level "L" usually.

Figure 6:
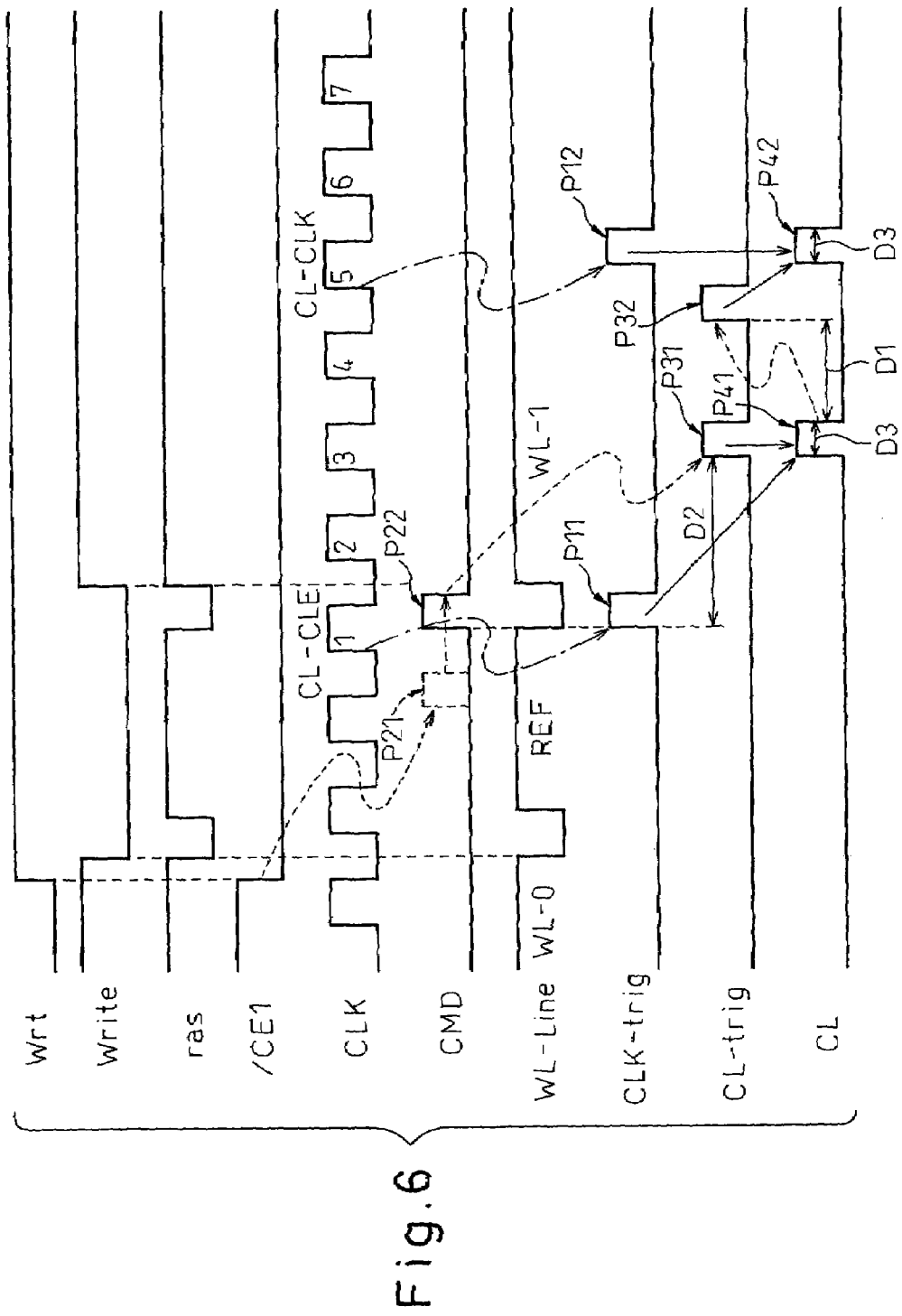
FIG. 6 shows an example of write operation signal waveforms when a refresh operation is carried out during a burst operation in a semiconductor memory device of the present invention.

FIG. 6 shows an example of a waveform of single in the write operation when refresh operation is performed during a burst operation in a semiconductor memory device of the present invention when the present invention is applied to the operation shown in FIG. 1B described above.

First, the chip enable signal /CE1 is changed to a low level "L" and is activated, the clock signal (CLK) is input into the clock trigger signal generating circuit 4 and, for example, the clock trigger signal (CLK-trig: pulse P11, P12) is output at a cycle corresponding to four CLK pulses. For example, in the read/write trigger signal generating circuit 5 shown in FIG. 4, the read/write signal (CL) is set low level "L" in an initial state, and a signal in high level "H" is supplied to one input of the NOR gate 55 via the inverter 53 and delay circuit 51, therefore, the NOR gate 55 outputs low level "L", with disregard to the level of the state signal (WL-change) which represents word line changing. Accordingly, the read/write trigger signal generating circuit 5 generates the read/write trigger signal (CL-trig: Pulse P31) according to the internal command signal (CMD: Pulse P22) from the internal command signal generating circuit 2 which is delayed by delay time D2 in the delay circuit 52.

After that, for example, the read/write signal generating circuit 6 shown in FIG. 5 receives "CLK-trig" from the clock trigger signal generating circuit 4 and the "CLK-trig" described above from the read/write trigger signal generating circuit 5 and outputs "CL". Namely, as described above, in the read/write signal generating circuit 6 shown in FIG. 5, the first flip-flop FF1 is set by "CLK-trig", and the second flip-flop FF2 is set by "CL-trig". When both flip-flops FF1, FF2 are set, the output from the NAND gate 644 varies from high level "H" to low level "L", the pulse width is determined to delay by delay time D3 by the delay circuit 61 and after that, the level is varies from high "H" to low "L". The output from the NAND gate 644 is inverted in the inverter 622 and is output as the first signal "CL" (pulse P41).

As described above, according to a semiconductor memory device of the present invention, "CL" can be kept waiting until "CL-trig" is output even if, for example, "CL-CLK" is generated before the pulse of the word line (WL-1) is raised after REF. As a result, the signal /CE1 is in low level earlier than the aforementioned operations shown in FIG. 1A and FIG. 1B, and therefore the recovery time can be reduced.

Accordingly, if "CL" (pulse P41) is generated once, the subsequent pulse (pulse P42) is generated from the last "CL". Namely, for example, in the read/write trigger signal generating circuit 5, "CL" having the pulse P41 is supplied to the inverter 53. However, "CMD" is already in low level "L", and a signal (pulse P32) which is made by delaying "CL" (pulse P41) for the time D1 is input as the subsequent signal CL-trig into, for example, the read/write signal generating circuit 6 shown in FIG. 5. The read/write signal generating circuit 6 generates the subsequent "CL" (pulse P42) after the input of "CLK-trig" (pulse P12) from the clock trigger signal generating circuit 4.

For example, in a burst write operation (WRITE), according to "CL" generated as above, for example, every four words of data are written in the memory core, or, for example, the WRITE is finished because of the input of a burst write operation complete command from the outside.

Figure 7:
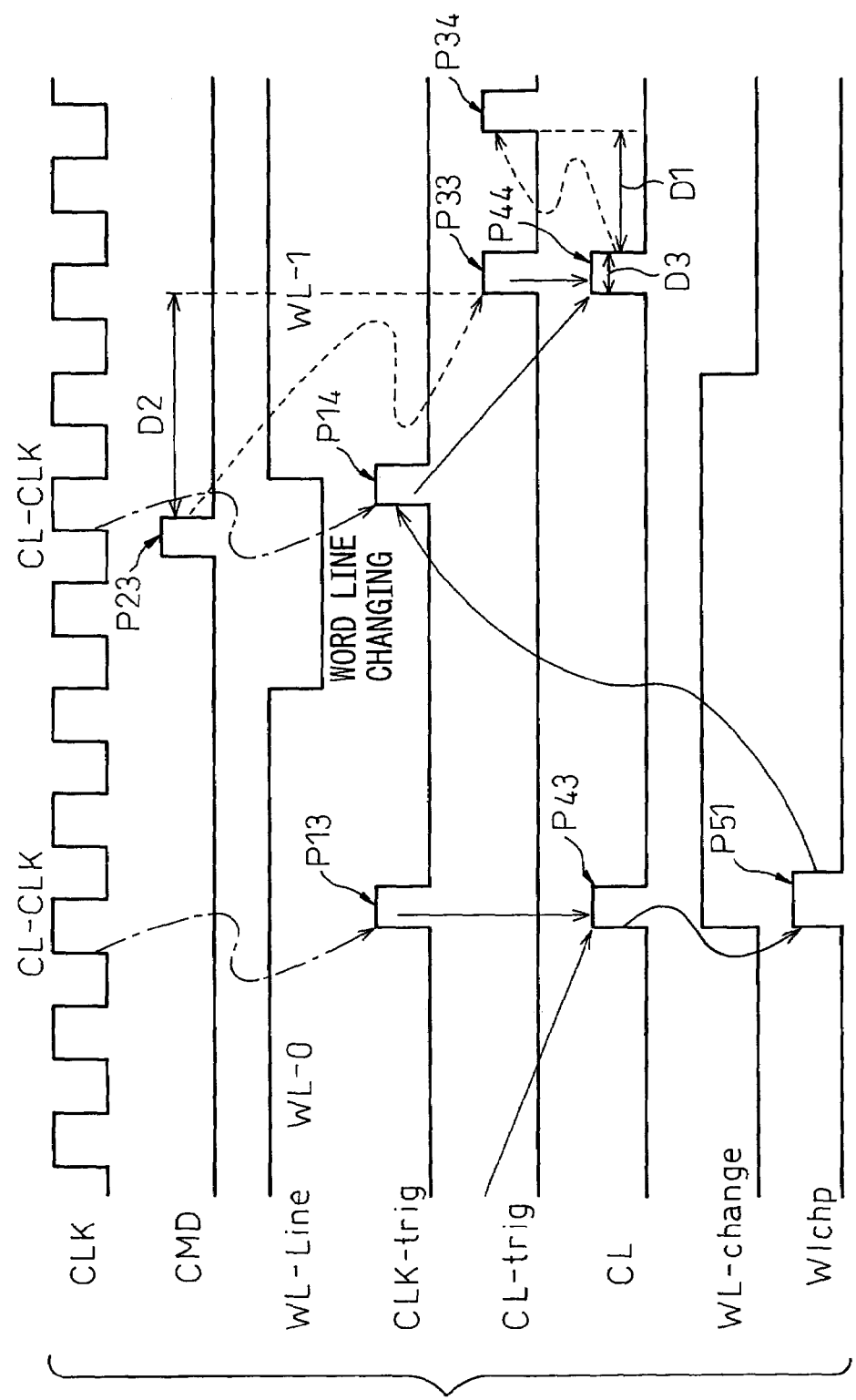
FIG. 7 shows an example of write operation signal waveforms when a word line changing is carried out during a burst operation in an embodiment of a semiconductor memory device of the present invention.

FIG. 7 shows an example of write operation signal waveform if word line changing is performed during a burst operation in an embodiment of a semiconductor memory device of the present invention when the present invention is applied to the operation shown in FIG. 2 described above. Namely, in FIG. 7, shows a waveform in which the burst write operation is performed over from a write operation to a word line (for example, WL-0) to the next word line (for example, WL-1) in the semiconductor memory device in which the burst operation with an unlimited burst length (BL) is possible. In the burst operation, the column address and the row address are generated internally and, when the column address is at the top, a reset operation (pre-charge operation) in a row side is performed and immediately after that the word line of the next row address is activated so that the burst operation can continue.

First, when a "CLK-trig" (pulse P13) is output from the "CL-CLK" in which the CL request is generated from "CLK" at a cycle corresponding to four CLK pulses and "WL-change" changes to low level "L" to high level "H", the signal CL (pulse P43) is output according thereto. If the word line changing request signal (wlchp: a pulse P51) is input from the word line changing request signal generating circuit 3 to the internal command signal generating circuit 2 and a state signal to indicate a change of the word line changes to low level "L" to high level "H", the NOR gate 55 of the read/write trigger signal generating circuit 5 shown in FIG. 4 is low level "L" is low level "L", and the read/write trigger signal (CL-trig: pulse P33) which is output via the NOR gate 56 and inverter 54 corresponds to a signal which is made by delaying "CMD" (pulse P23) for the delay time D2.

Likewise the above description with reference to FIG. 6, in the read/write signal generating circuit 6 shown in FIG. 5, the first flip-flop FF1 is set by "CLK-trig" (pulse P14) and the second flip-flop FF2 is set by "CL-trig" (pulse P33), and when both flip-flops FF1 and FF2 are set, the output from the NAND gate 644 changes from high level "H" to low level "L" and a pulse width is determined delaying for the delay time D3 by the delay circuit 61, and after that, the read/write signal generating circuit 6 changes from high level "H" to low level "L". The output from the NAND gate 644 is inverted in the inverter 622 and is output as "CL" (pulse P44). If "CL" (pulse P44) is generated, the following "CL" is generated using "CL-trig" (pulse P34: corresponding to P32 in FIG. 6) generated from the latest "CL" likewise the above description with reference to FIG. 6.

As described above, according to a semiconductor memory device of the present invention, for example, if "CL-CLK" is generated during changing a word line, generation of "CL" can be kept waiting for an output of "CL-trig". As a result, the CLK cycle can be shorter than the operation described in FIG. 2. If "CL-trig" is output just prior to word line changing, "CL" is output immediately after generation of "CLK-trig" during word line changing, and therefore, "CL-trig" is not generated when a word line is changed.

The above explanation can be applied not only to a burst write operation of the semiconductor memory device, but also to a burst read operation, and "CL" generated in the same circuit can be used to process. Furthermore, a circuit structure of the above described embodiments can be hidden a time from an input of an external control signal to a start of an internal CLK operation, by keeping CL output waiting.

According to the present invention, if a refresh operation and a word line changing operation can occur during a burst operation, the performance of a semiconductor memory device can be prevented from declining.

The present invention can be widely applied to a semiconductor memory device in which a burst operation is performed, for example, the present invention can be applied to a pseudo SRAM which can be used as well as an SRAM using a DRAM core memory, various semiconductor memory devices in which a memory core requiring a refresh operation and a burst operation is performed or, various semiconductor memory devices in which a burst operation is performed over plural word lines.

Many different embodiments of the present invention may be constructed without departing from the scope of the present invention, and it should be understood that the present invention is not limited to the specific embodiments described in this specification, except as defined in the appended claims.

What is claimed is:

1. A semiconductor memory device in which a burst operation is performed using a memory core, comprising:

a read/write trigger signal generating circuit generating a read/write signal request from a predetermined timing signal during the burst operation;

a read/write signal generating circuit receiving an output signal from said read/write trigger signal generating circuit, and outputting a read/write signal after both a core operations, just prior to receipt of the output signal is complete, and a subsequent activation of the row lines is complete, and a clock trigger signal generating circuit to generate a clock operation signal from a clock signal, wherein, when an output signal of said clock trigger signal generating circuit and an output sipnal of said read/write trigger generating circuit are both received, said read/write signal generating circuit generates the read/write signal.

2. The semiconductor memory device as claimed in claim 1, wherein said semiconductor memory device is a DRAM.

3. The semiconductor memory device as claimed in claim 1, wherein said semiconductor memory device is structured as a pseudo SRAM.

4. A semiconductor memory device in which a burst operation is performed using a memory core, wherein a read/write signal request is generated from a predetermined timing signal during the burst operation, but no read/write signal is generated until the core operation just prior to generation of the read/write signal request is complete and the subsequent activation of the row lines is complete, and wherein during the burst operation, a column address and a row address are internally generated, and when the column address is at the top, a reset operation of the row lines is performed and, immediately thereafter. a word line of the next row address is activated so that the burst operation is sequentially continued.

5. The semiconductor memory device as claimed in claim 4, wherein the predetermined timing signal is a clock signal or an internal timing signal.

6. The semiconductor memory device as claimed in claim 4, wherein the generation of the read/write signal is kept waiting in both the reading and the writing operations.

7. The semiconductor memory device as claimed in claim 4, wherein the read/write signal is generated when a read/write operation signal generated from a command signal and a clock operation signal generated from a clock signal are received.

8. The semiconductor memory device as claimed in claim 4, wherein said semiconductor memory device is a DRAM.

9. The semiconductor memory device as claimed in claim 4, wherein said semiconductor memory device is structured as a pseudo SRAM.

10. A semiconductor memory device in which a burst operation is performed using a memory core, wherein a read/write signal request is generated from a predetermined timing signal during the burst operation, but no read/write signal is generated until the core operation iust orior to generation of the read/write signal request is complete and the subsequent activation of the row lines is complete, and wherein if a first read/write signal is output, a second read/write signal operation signal is generated which is equivalent to a first read/write trigger operation generated from a command signal taking a timing from the first read/write signal, and when the second read/write operation signal and a clock operation signal generated at the next clock timing are both received, a subsequent read/write signal is generated.

11. A semiconductor memory device in which a burst operation is performed using a memory core, wherein a read/write signal request is generated from a predetermined timing signal during the burst operation. but no read/write signal is generated until the core operation just prior to generation of the read/write signal request is complete and the subsequent activation of the row lines is complete, and wherein, when a column address and a row address are internally generated during the burst operation and a reset operation is performed at the instant of the column address being at the top and, immediately thereafter, a word line of the next row address is activated, to continue the burst operation, a third read/write operation signal is generated by taking timing from a word line start-up signal, and when the third read/write operation signal and a clock operation signal generated in the next clock timing are received, a subsequent read/write signal is generated.

12. A method of controlling a semiconductor memory device in which a burst operation is performed using a memory core requiring a refresh operation, wherein:

a read/write signal request is generated from a predetermined timing signal during the burst operation but a read/write signal is not generated until the latest core operation is complete and the subsequent activation of a row side is complete, and wherein during the burst operation, a column address and a row address are internally generated, and when the column address is at the top, a reset operation of the row lines is performed and, immediately thereafter, a word line of the next row address is activated so that the burst operation is sequentially continued.

13. The method of controlling a semiconductor memory device as claimed in claim 12, wherein the predetermined timing signal is a clock signal or an internal timing signal.

14. The method of controlling a semiconductor memory device as claimed in claim 12, wherein the generation of the read/write signal is kept waiting in both the reading and the writing operations.

15. The method of controlling a semiconductor memory device as claimed in claim 12, wherein the read/write signal is generated when a read/write operation signal generated from a command signal and a clock operation signal generated from a clock signal are received.

16. The method of controlling a semiconductor memory device as claimed in claim 14, wherein said semiconductor memory device is a DRAM.

17. The method of controlling a semiconductor memory device as claimed in claim 12, wherein said semiconductor memory device is structured as a pseudo SRAM.

18. A method of controlling a semiconductor memory device in which a burst operation is performed using a memory core requiring a refresh operation, wherein a read/write signal request is generated from a predetermined timing signal during the burst operation but a read/write signal is not generated until the latest core operation is complete and the subsequent activation of the row lines is complete, and wherein if a first read/write signal is output, a second read/write signal operation signal is generated which is equivalent to a first read/write operation signal generated from a command signal taking a timing from the first read/write signal, and when the second read/write operation signal and a clock operation signal generated at the next clock timing are received, the subsequent read/write signal is generated.

19. A method of controlling a semiconductor memory device in which a burst operation is performed using a memory core requiring a refresh operation,
wherein a read/write signal request is generated from a predetermined timing signal during the burst operation but a read/write signal is not generated until the latest core operation is complete and the subsequent activation of the row lines is complete, and
wherein when a column address and a row address are internally generated during the burst operation and a reset operation is performed at the instant of the column address being at the top and a word line of the next row address is activated, to continue the burst operation,
a third read/write operation signal is generated by taking timing from a word line start-up signal, and when the third read/write operation signal and a clock operation signal generated in the next clock timing are received, the subsequent read/write signal is generated.

* * * * *